United States Patent
Ode et al.

(10) Patent No.: US 9,209,394 B2
(45) Date of Patent: Dec. 8, 2015

(54) RESISTANCE CHANGE ELEMENT AND METHOD FOR MANUFACTURING SAME

(71) Applicant: Kabushiki Kaisha Toshiba, Minato-ku (JP)

(72) Inventors: Hiroyuki Ode, Mie-ken (JP); Takeshi Yamaguchi, Mie-ken (JP); Masaki Yamato, Mie-ken (JP); Shigeki Kobayashi, Mie-ken (JP); Yoshinori Nakakubo, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/188,892

(22) Filed: Feb. 25, 2014

(65) Prior Publication Data

US 2015/0108420 A1    Apr. 23, 2015

Related U.S. Application Data

(60) Provisional application No. 61/892,184, filed on Oct. 17, 2013.

(51) Int. Cl.
  *H01L 45/00* (2006.01)
  *H01L 27/24* (2006.01)

(52) U.S. Cl.
  CPC ............ *H01L 45/146* (2013.01); *H01L 45/04* (2013.01); *H01L 45/12* (2013.01); *H01L 45/1233* (2013.01); *H01L 45/1608* (2013.01); *H01L 27/249* (2013.01); *H01L 27/2481* (2013.01)

(58) Field of Classification Search
  CPC ...... H01L 45/04; H01L 27/024; H01L 45/144
  USPC ............................................................ 257/4
  See application file for complete search history.

(56) References Cited

U.S. PATENT DOCUMENTS

| | | | |
|---|---|---|---|
| 6,445,033 B1* | 9/2002 | Hasegawa | 257/324 |
| 8,183,553 B2 | 5/2012 | Phatak et al. | |
| 8,343,813 B2 | 1/2013 | Kuse et al. | |
| 2005/0280069 A1* | 12/2005 | Mizushima et al. | 257/314 |
| 2012/0012807 A1 | 1/2012 | Yamaguchi et al. | |
| 2012/0217461 A1 | 8/2012 | Kobayashi et al. | |

(Continued)

OTHER PUBLICATIONS

Z. Wei, et al., "Demonstration of High-density ReRAM Ensuring 10-year Retention at 85° C. Based on a Newly Developed Reliability Model," © 2011 IEEE, (4 pages).
M. Ueki, et al, "Low-Power Embedded ReRAM Technology for IoT Applications," 2015 Symposium on VLSI Technology Digest of Technical Papers, (2 pages).

(Continued)

*Primary Examiner* — Karen Kusumakar
*Assistant Examiner* — Adam S Bowen
(74) *Attorney, Agent, or Firm* — Oblon, McClelland, Maier & Neustadt, L.L.P.

(57) ABSTRACT

According to one embodiment, a resistance change element includes: a first electrode; a second electrode; and a resistance change film provided between the first electrode and the second electrode, and the resistance change film including: a first transition metal oxide-containing layer; a second transition metal oxide-containing layer; and an intermediate layer provided between the first transition metal oxide-containing layer and the second transition metal oxide-containing layer, the intermediate layer having a higher crystallization temperature than the first transition metal oxide-containing layer and the second transition metal oxide-containing layer, and the intermediate layer including an amorphous material.

14 Claims, 4 Drawing Sheets

(56) References Cited

U.S. PATENT DOCUMENTS

2012/0267598 A1* 10/2012 Sakotsubo et al. .......... 257/4
2013/0043451 A1   2/2013 Lee et al.

OTHER PUBLICATIONS

Y. Hayakawa, et al, "Highly reliable TaOx ReRAM with centralized filament for 28-nm embedded application," 2015 Symposium on VLSI Technology Digest of Technical Papers, (2 pages).

* cited by examiner

RESISTANCE CHANGE ELEMENT AND METHOD FOR MANUFACTURING SAME

CROSS-REFERENCE TO RELATED APPLICATIONS

This application is based upon and claims the benefit of priority from U.S. Provisional Patent Application 61/892,184, filed on Oct. 17, 2013; the entire contents of which are incorporated herein by reference.

FIELD

Embodiments described herein relate generally to a resistance change element and a method for manufacturing the same.

BACKGROUND

There is known a resistance change material (film) for which the resistance value of the film is changed by a conductive path, called filament, in the film. The switching current may become larger depending on the formation state of the filament in the resistance change film.

DETAILED DESCRIPTION

Figure 1A:
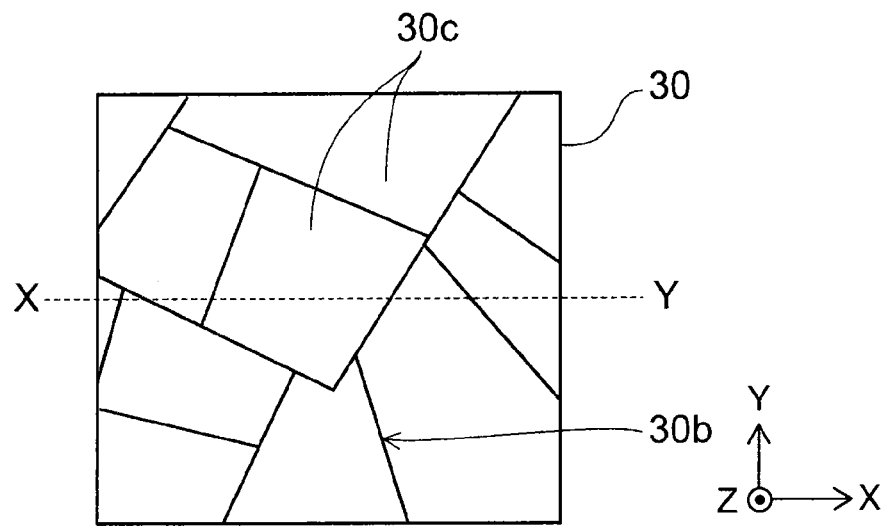
FIG. 1A is an exemplary schematic plan view of a resistance change element according to this embodiment.

In general, according to one embodiment, a resistance change element includes: a first electrode; a second electrode; and a resistance change film provided between the first electrode and the second electrode, and the resistance change film including: a first transition metal oxide-containing layer; a second transition metal oxide-containing layer; and an intermediate layer provided between the first transition metal oxide-containing layer and the second transition metal oxide-containing layer, the intermediate layer having a higher crystallization temperature than the first transition metal oxide-containing layer and the second transition metal oxide-containing layer, and the intermediate layer including an amorphous material.

Embodiments will now be described with reference to the drawings. In the following description, like members are labeled with like reference numerals. The description of the members once described is omitted appropriately.

Figure 1B:
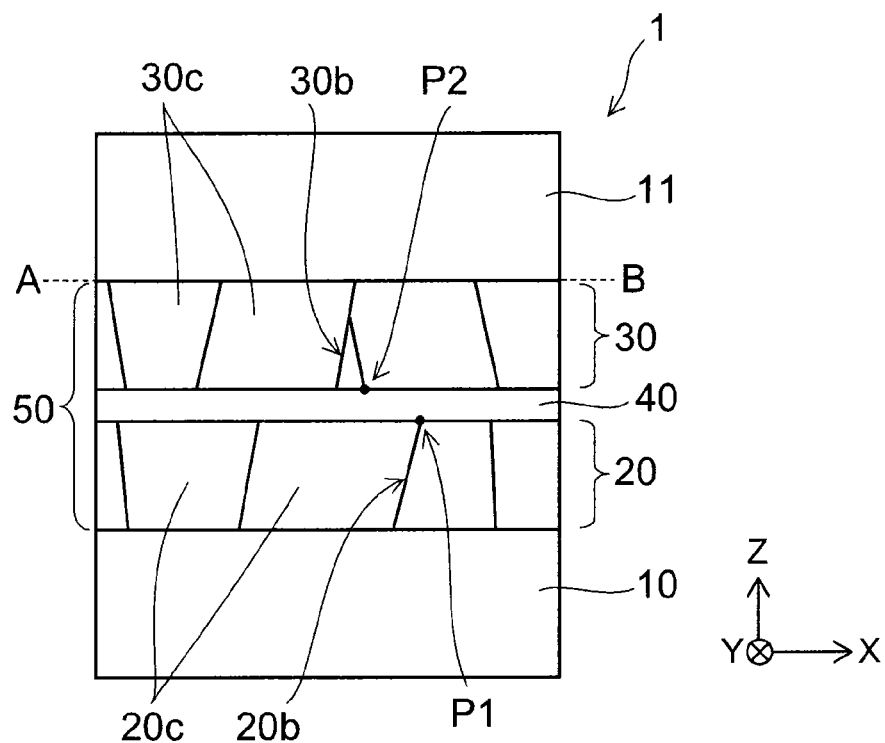
FIG. 1B is an exemplary schematic sectional view.

FIG. 1A is an exemplary schematic plan view of a resistance change element according to this embodiment, and FIG. 1B is an exemplary schematic sectional view.

FIG. 1A shows an exemplary cross section at the position of line A-B in FIG. 1B as viewed from above. In other words, FIG. 1A shows the upper surface of the transition metal oxide-containing layer 30 after the electrode 11 is removed from the resistance change element 1 shown in FIG. 1B.

The transition metal oxide-containing layer 30 includes a plurality of crystals 30c. As an example, the crystals 30c located at the upper surface or the lower surface of the transition metal oxide-containing layer 30 are different in surface orientation. A crystal grain boundary 30b is formed between the adjacent crystals 30c. Here, in the Z-direction, the transition metal oxide-containing layer 20 below the transition metal oxide-containing layer 30 also includes a plurality of crystals 20c. As an example, the crystals 20c located at the upper surface or the lower surface thereof are different in surface orientation.

FIG. 1B shows an exemplary cross section at the position of line X-Y in FIG. 1A.

As shown in FIG. 1B, the resistance change element 1 includes an electrode 10, an electrode 11, a transition metal oxide-containing layer 20, a transition metal oxide-containing layer 30, and an intermediate layer 40.

A resistance change film 50 is provided between the electrode 10 and the electrode 11. The stacked film includes the transition metal oxide-containing layer 20, the transition metal oxide-containing layer 30, and the intermediate layer 40.

The intermediate layer 40 is provided between the transition metal oxide-containing layer 20 and the transition metal oxide-containing layer 30. The crystallization temperature of the intermediate layer 40 is higher than the crystallization temperature of the transition metal oxide-containing layer 20 and the transition metal oxide-containing layer 30. The intermediate layer 40 includes an amorphous material. In the Z-direction, the major surfaces of the intermediate layer 40 are in contact with the transition metal oxide-containing layer 20 and the transition metal oxide-containing layer 30, respectively.

The transition metal oxide-containing layer 20 and the transition metal oxide-containing layer 30 include e.g. at least one of hafnium oxide ($HfO_2$), tantalum oxide ($Ta_2O_5$), zirconium oxide ($ZrO_2$), titanium oxide ($TiO_2$), and niobium oxide ($Nb_2O_5$). For instance, the transition metal oxide-containing layer 20 and the transition metal oxide-containing layer 30 may be made of the same material. The transition metal oxide-containing layer 20 and the transition metal oxide-containing layer 30 may be different in orientation.

The intermediate layer 40 includes e.g. at least one of aluminum oxide ($Al_2O_3$), silicon oxide ($SiO_2$), silicon nitride ($Si_3N_4$), titanium nitride (TiN), and titanium oxide ($TiO_2$).

The electrode 10, 11 includes e.g. at least one of titanium nitride (TiN), nickel (Ni), tantalum nitride (TaN), molybdenum nitride (MoN), tungsten nitride (WN), and polysilicon.

The crystal grain boundaries 20b, 30b included, respectively, in the transition metal oxide-containing layer 20 and the transition metal oxide-containing layer 30 are disconnected by the intermediate layer 40. The crystal grain boundary 20b, 30b includes an oxygen-deficient oxide. When a voltage is applied between the electrode 10 and the electrode 11, a conductive path may be formed along the crystal grain boundary 20b, 30b. Furthermore, the position P1 of the crystal grain boundary 20b of the transition metal oxide-containing layer 20 in contact with the intermediate layer 40 and the position P2 of the crystal grain boundary 30b of the transition metal oxide-containing layer 30 in contact with the intermediate layer 40 are displaced in the X-direction or the Y-direction.

A method for manufacturing the resistance change element 1 is now described.

FIGS. 2A to 2E are exemplary schematic sectional views showing a process for manufacturing a resistance change element according to this embodiment.

Figure 2A:
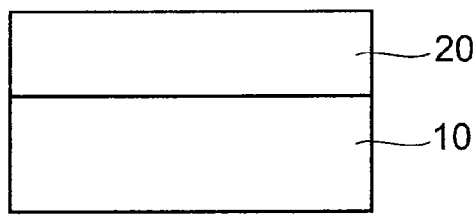
FIGS. 2A to 2E are exemplary schematic sectional views showing a process for manufacturing a resistance change element according to this embodiment.

First, as shown in FIG. 2A, a transition metal oxide-containing layer 20 is formed on a foundation layer (e.g., electrode 10). For instance, a $HfO_2$ film as a transition metal oxide-containing layer 20 can be formed by means of ALD, PVD, CVD or the like. The film thickness of the transition metal oxide-containing layer 20 is 1-5 nm. Here, as an example, the film thickness is set to 2 nm. At this stage, the transition metal oxide-containing layer 20 includes an amorphous material.

Figure 2B:
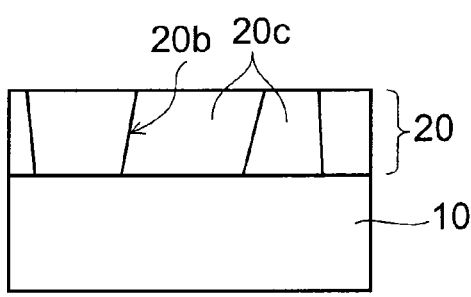

Next, as shown in FIG. 2B, the transition metal oxide-containing layer 20 is heated at a temperature higher than the crystallization temperature of the transition metal oxide-containing layer 20. Heating may be performed by an RTA (rapid temperature annealing) apparatus or the like. The heating temperature is 400-800° C. Here, as an example, the heating temperature is set to 650° C.

By this heating, crystallization of the transition metal oxide-containing layer 20 proceeds. Thus, a crystal grain boundary 20b can be formed between the crystals 20c. The crystals 20c are different in orientation. Here, the crystal grain boundary 20b is exposed at the upper surface of the transition metal oxide-containing layer 20.

Figure 2C:
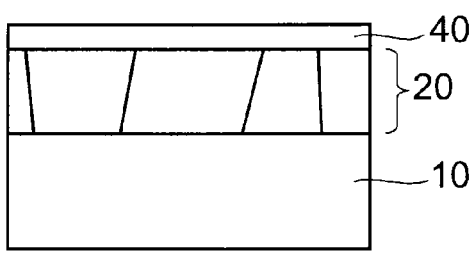

Next, as shown in FIG. 2C, an intermediate layer 40 having a higher crystallization temperature than the transition metal oxide-containing layer 20 is formed on the transition metal oxide-containing layer 20. The film thickness of the intermediate layer 40 is 0.5-2 nm. Here, as an example, the film thickness is set to 0.5 nm. The intermediate layer 40 includes an amorphous material.

Figure 2D:
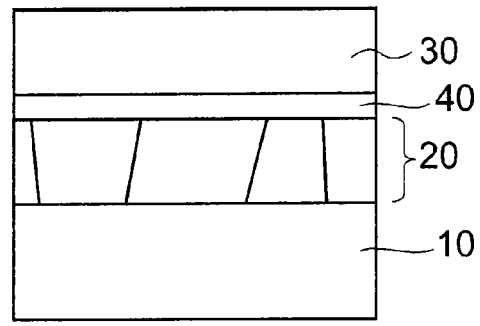

Next, as shown in FIG. 2D, a transition metal oxide-containing layer 30 having a lower crystallization temperature than the intermediate layer 40 is formed on the intermediate layer 40. For instance, a $HfO_2$ film as a transition metal oxide-containing layer 30 may be formed by ALD, PVD, CVD or the like. The film thickness of the transition metal oxide-containing layer 30 is 1-5 nm. Here, as an example, the film thickness is set to 2 nm. At this stage, the transition metal oxide-containing layer 30 includes an amorphous material.

Figure 2E:
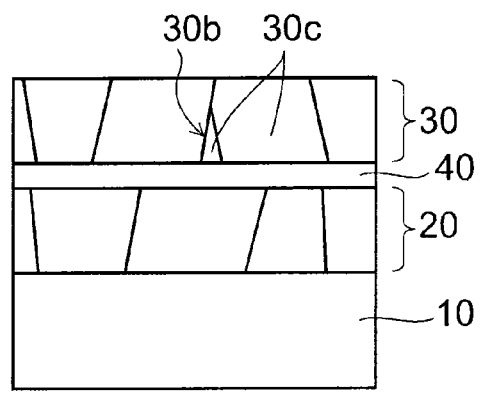

Next, as shown in FIG. 2E, the transition metal oxide-containing layer 30 is heated at a temperature higher than the crystallization temperature of the transition metal oxide-containing layer 30 and lower than the crystallization temperature of the intermediate layer 40. Heating may be performed by an RTA apparatus or the like. The heating temperature is 400-800° C. Here, as an example, the heating temperature is set to 650° C.

By this heating, crystallization of the transition metal oxide-containing layer 30 proceeds. Thus, a crystal grain boundary 30b may be formed between the crystals 30c. Here, the crystal grain boundary 30b reaches the lower surface and the upper surface of the transition metal oxide-containing layer 30. Furthermore, independent crystal grain boundaries are formed in the transition metal oxide-containing layer 20 and the transition metal oxide-containing layer 30. The crystals 30c are different in orientation. That is, the crystal grain boundaries of the transition metal oxide-containing layer 20 and the transition metal oxide-containing layer 30 are discontinuous in the intermediate layer 40. Here, the crystal 20c, 30c does not need to be a complete crystal.

The heating treatment of the transition metal oxide-containing layer 30 may be performed at the same time as the annealing treatment in what is called the post-treatment.

The operation of the resistance change element 1 is now described.

Figure 3A:
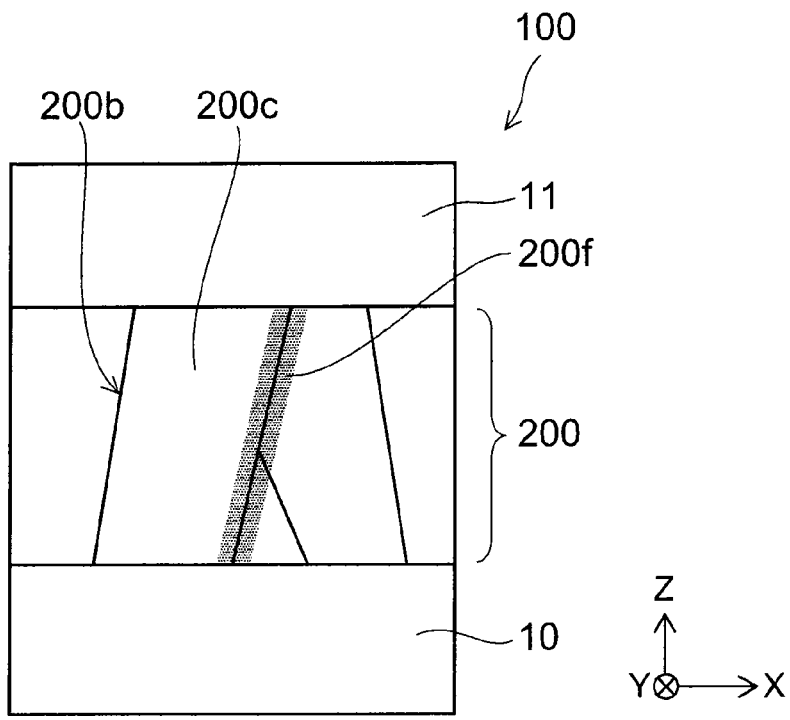
FIG. 3A is an exemplary schematic sectional view showing the operation of a resistance change element according to a comparative example.
Figure 3B:
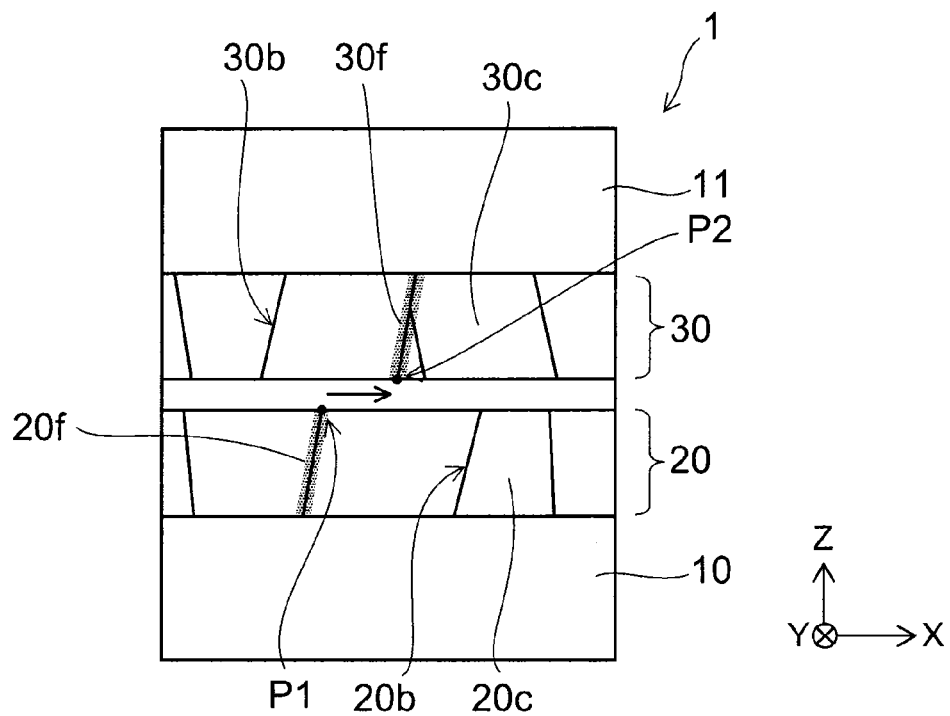
FIG. 3B is an exemplary schematic sectional view showing the operation of the resistance change element according to this embodiment.

FIG. 3A is an exemplary schematic sectional view showing the operation of a resistance change element according to a comparative example, and FIG. 3B is an exemplary schematic sectional view showing the operation of the resistance change element according to this embodiment.

Here, as an example, the material of the transition metal oxide-containing layer 200 and the transition metal oxide-containing layer 20, 30 is $HfO_2$.

The intermediate layer 40 is not provided in the resistance change element 100 of the comparative example shown in FIG. 3A. For instance, the transition metal oxide-containing layer 200 of the comparative example is a layer formed by heating a monolayer transition metal oxide-containing layer 200 at e.g. 650° C. The transition metal oxide-containing layer 200 includes a crystal 200c and a crystal grain boundary 200b. The film thickness of the transition metal oxide-containing layer 200 is 4 nm.

In this resistance change element 100 including the transition metal oxide-containing layer 200, a forming voltage is applied between the electrodes 10 and 11 to perform the forming operation. Then, a conductive path 200f may be formed in the transition metal oxide-containing layer 200.

In contrast, in the resistance change element 1 shown in FIG. 3B, an intermediate layer 40 is provided between the transition metal oxide-containing layer 20 and the transition metal oxide-containing layer 30. In this element, a forming voltage is applied between the electrodes 10 and 11 to perform the forming operation. Then, conductive paths 20f, 30f are formed in the transition metal oxide-containing layer 20 and the transition metal oxide-containing layer 30, respectively. Furthermore, in the resistance change element 1, the position P1 of the crystal grain boundary 20b of the transition metal oxide-containing layer 20 in contact with the intermediate layer 40 and the position P2 of the crystal grain boundary 30b of the transition metal oxide-containing layer 30 in contact with the intermediate layer 40 are displaced in the X-direction or the Y-direction. That is, the conductive path 20f and the conductive path 30f are discontinuous in the intermediate layer 40.

Thus, in the resistance change element 1, the current at the forming operation flows through the current path from the conductive path 20f of the transition metal oxide-containing layer 20 through the intermediate layer 40 to the conductive path 30f of the transition metal oxide-containing layer 30. Here, the intermediate layer 40 connecting the position P1 and the position P2 functions as a resistance element. Furthermore, also at the time of the set operation after the forming operation, the current flows through a similar path from the conductive path 20f of the transition metal oxide-containing layer 20 through the intermediate layer 40 to the conductive path 30f of the transition metal oxide-containing layer 30.

Here, as viewed in the Z-direction, the crystal grain boundaries of the transition metal oxide-containing layer 20 and the transition metal oxide-containing layer 30 may cross each other. In the embodiment, it is sufficient that at least the position P1 of the conductive path 20f and the position P2 of the conductive path 30f be displaced in the X-direction or the Y-direction.

Thus, the reduction of switching current is realized in the resistance change element 1 of this embodiment. This realizes a resistance change element 1 with high tolerance and high reliability.

Figure 4A:
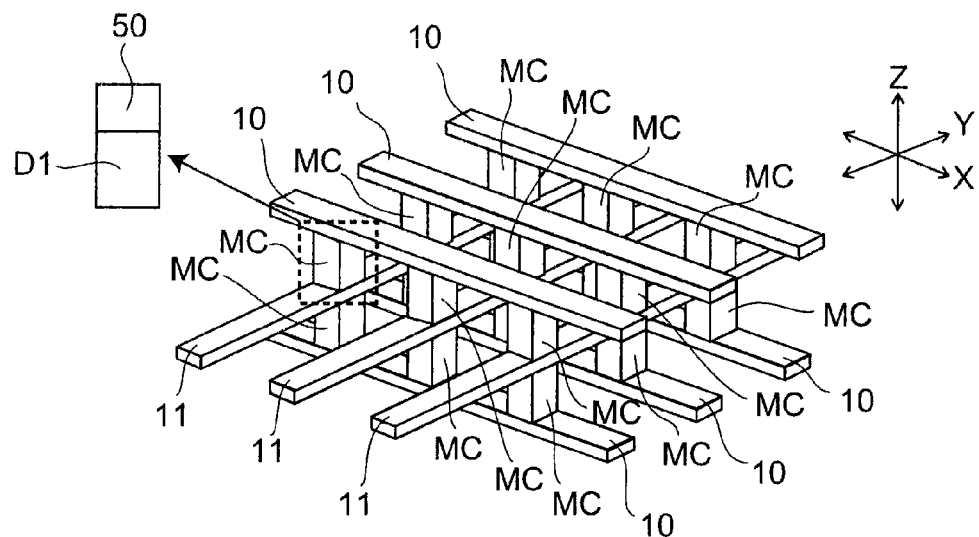
FIG. 4A shows an exemplary memory cell array including the resistance change element of this embodiment.
Figure 4B:
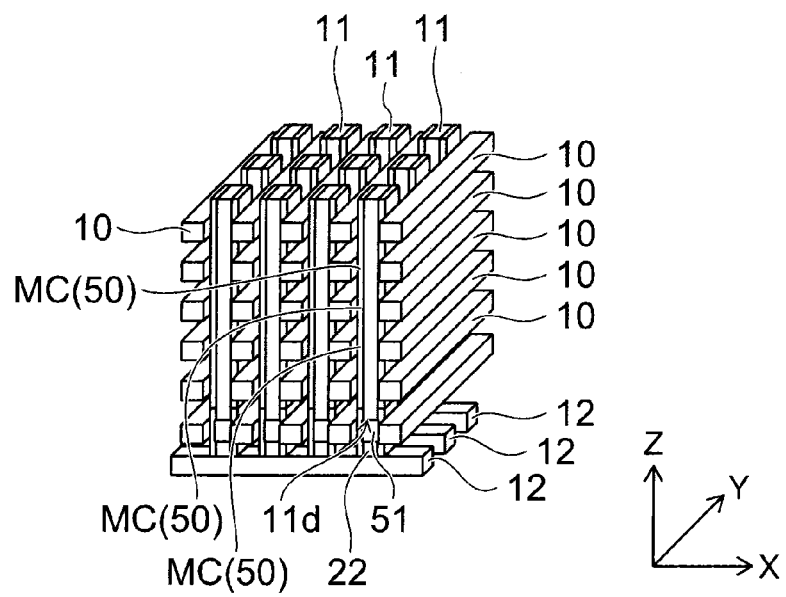
FIG. 4B shows an alternative exemplary memory cell array including the resistance change element of this embodiment.

FIG. 4A shows an exemplary memory cell array including the resistance change element of this embodiment, and FIG. 4B shows an alternative exemplary memory cell array including the resistance change element of this embodiment.

FIG. 4A shows an exemplary cross-point memory cell array based on the resistance change film 50. As an example, FIG. 4A shows two layers of the memory cell array. The memory cell MC including the resistance change film 50 and a diode DI is provided at the cross point of a bit line (electrode 10) and each word line (electrode 11). The memory cells MC are arranged in a matrix configuration in the X-direction and the Y-direction.

FIG. 4B shows an alternative exemplary cross-point memory cell array based on the resistance change film 50.

The memory cell array shown in FIG. 4B includes global bit lines 12, local bit lines (electrodes 11), word lines (electrodes 10), three-dimensionally arranged resistance change films 50, and selectors 51.

The global bit lines 12 extend in e.g. the X-direction and are arranged in the Y-direction. The local bit lines (electrodes 11) extend in e.g. the Z-direction (second direction) and are arranged in the Y-direction. The word lines (electrodes 10) extend in e.g. the Y-direction and are arranged in the Z-direction. A memory cell MC including resistance change film 50 is provided at the crossing position of each of the local bit lines (electrodes 11) and each of the word lines (electrodes 10).

Furthermore, a selector 51 is provided between each of the local bit lines (electrodes 11) and each of the global bit lines 12. One side (e.g., upper side) of the selector 51 may be directly connected to the local bit line (electrode 11). The other side (e.g., lower side) of the selector 51 is connected to the global bit line 12 via an extraction line 22.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A resistance change memory, comprising:
    a first electrode interconnect extending in a first direction;
    a second electrode interconnect extending in a second direction crossing the first direction; and
    a resistance change film provided between the first electrode interconnect and the second electrode interconnect, the resistance change film being provided at a first position, the first electrode interconnect and the second electrode interconnect crossing at the first position, and the resistance change film including:
    a first transition metal oxide-containing layer;
    a second transition metal oxide-containing layer; and
    an amorphous layer provided between the first transition metal oxide-containing layer and the second transition metal oxide-containing layer, the amorphous layer having a higher crystallization temperature than the first transition metal oxide-containing layer and the second transition metal oxide-containing layer,
    crystal grain boundaries of the first transition metal oxide-containing layer and the second transition metal oxide-containing layer being discontinuous by the amorphous layer provided between the first transition metal oxide-containing layer and the second transition metal oxide-containing layer.

2. The memory according to claim 1, wherein the first transition metal oxide-containing layer and the second transition metal oxide-containing layer include at least one of hafnium oxide, tantalum oxide, zirconium oxide, titanium oxide, and niobium oxide.

3. The memory according to claim 1, wherein the amorphous layer includes at least one of aluminum oxide, silicon oxide, silicon nitride, titanium oxide, and titanium nitride.

4. The memory according to claim 1, wherein a position of a crystal grain boundary of the first transition metal oxide-containing layer in contact with the amorphous layer is displaced at a position of a crystal grain boundary of the second transition metal oxide-containing layer in contact with the amorphous layer in a cross section in a direction from the first transition metal oxide-containing layer toward the second transition metal oxide-containing layer.

5. The memory according to claim 1, wherein a conductive path is formed along a crystal grain boundary of the first transition metal oxide-containing layer and the second transition metal oxide-containing layer.

6. The memory according to claim 1, wherein a material of the first transition metal oxide-containing layer same as a material of the second transition metal oxide-containing layer.

7. The memory according to claim 1, wherein an orientation of the first transition metal oxide-containing layer is different from an orientation of the second transition metal oxide-containing layer.

8. The memory according to claim 1, further comprising:
    a third electrode interconnect extending in a third direction crossing the second direction; and
    a selector provided between the third electrode interconnect and the second electrode interconnect.

9. The memory according to claim 1, wherein
    a filament can be formed in the first transition metal oxide-containing layer and in the second transition metal oxide-containing layer via the amorphous layer.

10. A resistance change memory, comprising:
    a first electrode interconnect extending in a first direction;
    a second electrode interconnect extending in a second direction crossing the first direction; and
    a resistance change film provided between the first electrode interconnect and the second electrode interconnect, the resistance change film being provided at a first position, the first electrode interconnect and the second electrode interconnect crossing at the first position, and the resistance change film including:
    a first transition metal oxide-containing layer;
    a second transition metal oxide-containing layer; and an amorphous layer provided between the first transition metal oxide-containing layer and the second transition metal oxide-containing layer, the first transition metal oxide-containing layer and the second transition metal oxide-containing layer including at least one of hafnium oxide, tantalum oxide, zirconium oxide, titanium oxide, and niobium oxide, and the amorphous layer including at least one of aluminum oxide, silicon oxide, silicon nitride, titanium oxide, and titanium nitride, crystal grain boundaries of the first transition metal oxide-containing layer and the second transition metal oxide-containing layer being discontinuous by the amorphous layer provided between the first transition metal oxide-containing layer and the second transition metal oxide-containing layer.

11. The memory according to claim 10, wherein an orientation of the first transition metal oxide-containing layer is different from an orientation of the second transition metal oxide-containing layer.

12. The memory according to claim 10, further comprising:

a third electrode interconnect extending in a third direction crossing the second direction; and a selector provided between the third electrode interconnect and the second electrode interconnect.

13. The memory according to claim 10, wherein a filament can be formed in the first transition metal oxide-containing layer and in the second transition metal oxide-containing layer via the amorphous layer.

14. A method for manufacturing a resistance change memory, comprising:

forming a first transition metal oxide-containing layer on a first layer;

heating the first transition metal oxide-containing layer at a temperature higher than crystallization temperature of the first transition metal oxide-containing layer;

forming an amorphous layer having a higher crystallization temperature than the first transition metal oxide-containing layer on the first transition metal oxide-containing layer;

forming a second transition metal oxide-containing layer having a lower crystallization temperature than the amorphous layer on the amorphous layer; and heating the second transition metal oxide-containing layer at a temperature higher than the crystallization temperature of the second transition metal oxide-containing layer and lower than the crystallization temperature of the amorphous layer, crystal grain boundaries of the first transition metal oxide-containing layer and the second transition metal oxide-containing layer being discontinuous by the amorphous layer formed between the first transition metal oxide-containing layer and the second transition metal oxide-containing layer.

* * * * *